United States Patent
Lee et al.

(10) Patent No.: US 7,842,622 B1
(45) Date of Patent: Nov. 30, 2010

(54) METHOD OF FORMING HIGHLY CONFORMAL AMORPHOUS CARBON LAYER

(75) Inventors: Woo-Jin Lee, Tama (JP); Atsuki Fukazawa, Tama (JP)

(73) Assignee: ASM Japan K.K., Tokyo (JP)

( * ) Notice: Subject to any disclaimer, the term of this patent is extended or adjusted under 35 U.S.C. 154(b) by 78 days.

(21) Appl. No.: 12/467,017

(22) Filed: May 15, 2009

(51) Int. Cl.
*H01L 21/312* (2006.01)
*C23C 16/26* (2006.01)

(52) U.S. Cl. .................. 438/780; 427/569; 427/249.1; 257/E21.27

(58) Field of Classification Search ................ 438/780; 427/569, 249.1; 257/E21.27
See application file for complete search history.

(56) References Cited

U.S. PATENT DOCUMENTS

| | | | |
|---|---|---|---|
| 6,573,030 B1 * | 6/2003 | Fairbairn et al. ............ 430/323 |
| 7,109,098 B1 * | 9/2006 | Ramaswamy et al. ....... 438/513 |
| 7,312,148 B2 * | 12/2007 | Ramaswamy et al. ....... 438/660 |
| 7,312,162 B2 * | 12/2007 | Ramaswamy et al. ....... 438/758 |
| 7,323,401 B2 * | 1/2008 | Ramaswamy et al. ....... 438/551 |
| 7,335,611 B2 * | 2/2008 | Ramaswamy et al. ....... 438/795 |
| 7,422,775 B2 * | 9/2008 | Ramaswamy et al. ....... 427/572 |
| 7,429,532 B2 * | 9/2008 | Ramaswamy et al. ....... 438/689 |
| 2003/0091938 A1 * | 5/2003 | Fairbairn et al. ............ 430/314 |
| 2005/0059262 A1 * | 3/2005 | Yin et al. .................... 438/780 |
| 2005/0101154 A1 * | 5/2005 | Huang ........................ 438/758 |
| 2005/0142361 A1 * | 6/2005 | Nakanishi et al. ........... 428/408 |
| 2005/0199013 A1 * | 9/2005 | Vandroux et al. ............. 65/386 |
| 2005/0287771 A1 * | 12/2005 | Seamons et al. ............ 438/482 |
| 2006/0014397 A1 * | 1/2006 | Seamons et al. ............ 438/778 |
| 2006/0260545 A1 * | 11/2006 | Ramaswamy et al. ....... 118/719 |
| 2006/0263540 A1 * | 11/2006 | Ramaswamy et al. ....... 427/569 |
| 2006/0264060 A1 * | 11/2006 | Ramaswamy et al. ....... 438/758 |
| 2007/0032004 A1 * | 2/2007 | Ramaswamy et al. ....... 438/197 |
| 2007/0032054 A1 * | 2/2007 | Ramaswamy et al. ....... 438/513 |
| 2007/0032082 A1 * | 2/2007 | Ramaswamy et al. ....... 438/689 |
| 2007/0032095 A1 * | 2/2007 | Ramaswamy et al. ....... 438/795 |
| 2007/0062453 A1 * | 3/2007 | Ishikawa ................. 118/723 R |
| 2007/0128538 A1 * | 6/2007 | Fairbairn et al. ............ 430/201 |
| 2008/0003824 A1 * | 1/2008 | Padhi et al. ................. 438/689 |
| 2008/0153311 A1 * | 6/2008 | Padhi et al. ................. 438/780 |
| 2009/0286402 A1 * | 11/2009 | Xia et al. .................... 438/703 |

(Continued)

OTHER PUBLICATIONS

A Study of CD Budget in Spacer Patterning Technology, by H. Mukai, E. Shiobara, S. Takahashi ad K. Hashimoto, Proc. of SPIE vol. 6924, 692406 (2008), pp. 1-8.

(Continued)

*Primary Examiner*—Mary Wilczewski
(74) *Attorney, Agent, or Firm*—Snell & Wilmer L.L.P.

(57) ABSTRACT

A method of forming a conformal amorphous hydrogenated carbon layer on an irregular surface of a semiconductor substrate includes: vaporizing a hydrocarbon-containing precursor; introducing the vaporized precursor and an argon gas into a CVD reaction chamber inside which the semiconductor substrate is placed; depositing a conformal amorphous hydrogenated carbon layer on the irregular surface of the semiconductor substrate by plasma CVD; and controlling the deposition of the conformal ratio of the depositing conformal amorphous hydrogenated carbon layer. The controlling includes (a) adjusting a step coverage of the conformal amorphous hydrogenated carbon layer to about 30% or higher as a function of substrate temperature, and (b) adjusting a conformal ratio of the conformal amorphous hydrogenated carbon layer to about 0.9 to about 1.1 as a function of RF power and/or argon gas flow rate.

17 Claims, 11 Drawing Sheets

U.S. PATENT DOCUMENTS

2010/0093187 A1* 4/2010 Lee et al. .................... 438/780

OTHER PUBLICATIONS

Double Patterning of Contact Array with Carbon Polymer, by W. Jung, G. Sim, S. Kim, C. Kim, K. Jeon, K. Kim, S. Park, B. Lee, S. Park, H. Cho and J. Kim, Proc. of SPIE vol. 6924, 69240C, (2008), pp. 1-10.

PDL Oxide Enabled Pitch Doubling, by N. Shamma, W. Chou, I. Kalinovski, D. Schlosser, T. Mountsier, C. Mui, R. Tarafdar and B. van Schravendijk, Proc. of SPIE vol. 6924, 69240D, (2008), pp. 1-10.

* cited by examiner

METHOD OF FORMING HIGHLY CONFORMAL AMORPHOUS CARBON LAYER

BACKGROUND

1. Field of the Invention

The present invention relates to semiconductor integrated circuit manufacturing and, more particularly to a method of forming a conformal amorphous carbon layer suitable for etching processes and double patterning processes.

2. Description of the Related Art

Integrated circuits fabricated on semiconductor substrates for large scale integration require multiple levels of metal interconnections to electrically interconnect the discrete layers of semiconductor devices on the semiconductor chips. The different levels of interconnections are separated by various insulating or dielectric layers, which have been etched via holes to connect one level of metal to the next.

The evolution of chip design continually requires faster circuitry and greater circuit density. The demands for faster circuits with greater circuit densities impose corresponding demands on the materials used to fabricate such integrated circuits. In particular, as the dimensions of integrated circuit components are reduced to the sub-micron scale, the demands for greater integrated circuit densities also impose demands on the process sequences used in the manufacture of integrated circuit components. For example, in process sequences that use conventional photo lithographic techniques, a layer of energy-sensitive resist is formed over a stack of material layers disposed on a substrate.

As the pattern dimensions are reduced, the thickness of the energy-sensitive resist must correspondingly be reduced in order to control pattern resolution. Such thin resist layers can be insufficient to mask underlying material layers during the pattern transfer step due to attack by the chemical etchant.

Recently, Amorphous hydrogenated carbon is widely used as hardmask material between the energy-sensitive resist layer and the underlying material layers to facilitate pattern transfer because of its good etch selectivity relative to silicon dioxide or silicon nitride, optical transparency, and good mechanical properties. However, current deposition processes for amorphous carbon hardmask result in poor step coverage and/or non-conformal sidewall protection of the hardmask on the uneven surface of the substrate making successful pattern transfer increasingly difficult as pattern densities continue to shrink.

If pre-etch critical dimension of the pattern is out of specification after photo-lithography, a rework process may be performed to remove the resist layer from the substrate and re-pattern the substrate with a new resist layer. During rework process, the surface of the underlying layer, amorphous carbon hardmask layer, may be attacked by the etchant used to remove the resist mask, thereby causing thickness of the hardmask to be reduced or the profile of the hardmask to be undercut.

The hardmask thickness loss or undercut profile associated with the rework process changes the uniformity and/or step coverage of the new resist layer formed over the hardmask layer, thereby contributing to inaccurate transfer of the desired pattern to the film stack, which may adversely influence subsequent processes used for interconnect formation and disadvantageously impact the overall electrical performance of the device.

In addition, for advanced lithography, the ability to pattern not only small pitches, but also small critical dimensions (CDs), is very important. For front-end applications, patterns may be narrowed after lithography development through the use of trim techniques during the subsequent etches process. For back-end applications, shrink techniques are needed to reduce trenches and contacts to the required narrow critical dimensions. The conformal deposition, using plasma enhanced chemical vapor deposition system, is a post-lithography process that covers the top and sidewalls of the photoresist with an amorphous carbon layer. This amorphous carbon layer has a high etch resistance for subsequent etch steps and can be removed with standard ash processes afterwards.

SUMMARY

An object of the disclosed embodiments of the present invention is to provide a method of forming a conformal amorphous carbon layer on a trench for an integrated circuit and to provide a method of forming a conformal amorphous carbon layer on a photoresist pattern for double patterning processing at low temperatures (e.g., 50° C. or lower). In an embodiment, this method may be applied to steps comprises positioning a substrate in a processing chamber, introducing a hydrocarbon source into the processing chamber with a carrier gas, introducing an additional gas into the processing chamber, and generating a plasma in the processing chamber. Consequently, a hydrocarbon-containing polymer film is deposited on a semiconductor substrate.

An embodiment provides a method of forming a conformal amorphous hydrogenated carbon layer on an irregular surface of a semiconductor substrate by plasma CVD, said irregular surface being constituted by a top surface and multiple recesses, each recess having a side wall and a bottom surface, said side wall being substantially or nearly perpendicular to the top surface, said bottom surface being substantially or nearly parallel to the top surface, said method comprising: (i) vaporizing a hydrocarbon-containing precursor; (ii) introducing said vaporized precursor and an argon gas into a CVD reaction chamber inside which the semiconductor substrate is placed; (iii) depositing a conformal amorphous hydrogenated carbon layer on the irregular surface of the semiconductor substrate by plasma polymerization of the precursor; and (iv) controlling the deposition of the conformal ratio of the depositing conformal amorphous hydrogenated carbon layer, said controlling comprising (a) adjusting a step coverage of the conformal amorphous hydrogenated carbon layer to about 30% or higher as a function of substrate temperature, and (b) adjusting a conformal ratio of the conformal amorphous hydrogenated carbon layer to about 0.9 to about 1.1 as a function of RF power and/or argon gas flow rate.

In the above, the step coverage is typically defined as a ratio of an average thickness of a portion of the conformal amorphous hydrogenated carbon layer deposited on the side wall of the recess to an average thickness of a portion of the conformal amorphous hydrogenated carbon layer deposited on the top surface, and the conformal ratio is typically defined as a ratio of a thickness of a portion of the conformal amorphous hydrogenated carbon layer deposited at a top of the side wall of the recess to a thickness of a portion of the conformal amorphous hydrogenated carbon layer deposited at a midpoint of the side wall of the recess or at a lowest point along the side wall of the recess if the lowest point is higher than the midpoint. In other embodiments, alternative definitions of the step coverage and conformal ratio can be used as described later.

In an embodiment, the adjusting of the step coverage may be performed at a substrate temperature of about 50° C. or lower. In an embodiment, the substrate temperature may be about 0° C. to about 50° C. or about 0° C. to about 25° C. In another embodiment, the substrate temperature may be up to about 100° C., depending on the desired step coverage and the desired conformal ratio, the aspect ratio and size of the trench in combination with the other controlling parameters. In an embodiment, the substrate temperature may be maintained using a cooling system, in some cases, it is difficult to constantly control the substrate temperature below 50° C. due to the gas temperature, plasma discharge, etc.

In any of the foregoing embodiments, the adjusting of the conformal ratio may be performed at an RF power of about 450 W or lower. In an embodiment, the RF power may be about 100 W to about 450 W or about 150 W to about 400 W. In another embodiment, the RF power may be up to about 800 W, depending on the desired step coverage and the desired conformal ratio, the aspect ratio and size of the trench in combination with the other controlling parameters.

In any of the foregoing embodiments, the adjusting of the conformal ratio may be performed at an argon gas flow rate of about 0.1 slm to about 0.8 slm. In an embodiment, the argon gas flow rate may be about 0.2 slm to about 0.6 slm. In another embodiment, the argon gas flow rate may be about 0 slm to about 1 slm, depending on the desired step coverage and the desired conformal ratio, the aspect ratio and size of the trench in combination with the other controlling parameters.

In any of the foregoing embodiments, the recesses may be formed by photo resist patterns each having a width of 10 nm to 100 nm and a height of 10 nm to 100 nm, and arranged at intervals each being about three times the width, wherein the conformal amorphous hydrogenated carbon layer is deposited on the side wall of the recesses at a thickness which is about the same as the width of the photo resist pattern, thereby arranging the conformal amorphous hydrogenated carbon layer deposited on the side wall of the recesses at intervals each being about the same as the width of the photo resist pattern.

In an embodiment, in order to form an amorphous hydrogenated carbon layer, as the hydrocarbon-containing precursor, a hydrocarbon-containing precursor ($C_\alpha H_\beta X_\gamma$, where $\alpha$ and $\beta$ are natural numbers, $\gamma$ is an integer including zero; X is O, N or F) may be used. In an embodiment, $\gamma$ is zero. Helium may be used as the carrier gas since it is easily ionized and is advantageous for initiating a plasma in a chamber with a low risk of arcing. The additional gas may be selected from the group consisting of He, Ar, Kr, Xe, and the molar flow rate of the additional gas may be greater than the molar flow rate of the hydrocarbon-containing precursor. The processing chamber may be maintained at a pressure of about 0.1 Torr to about 10 Torr after initiating a plasma therein. After the gases are introduced into the chamber, organic monomers are polymerized by a plasma polymerization reaction to form an organic carbon polymer film on a substrate surface, and the resultant film formed can be used as a hard mask or patterning layer for various semiconductor processing.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention. The drawings are oversimplified for illustrative purpose and are not necessarily to scale.

DETAILED DESCRIPTION

Figure 1:
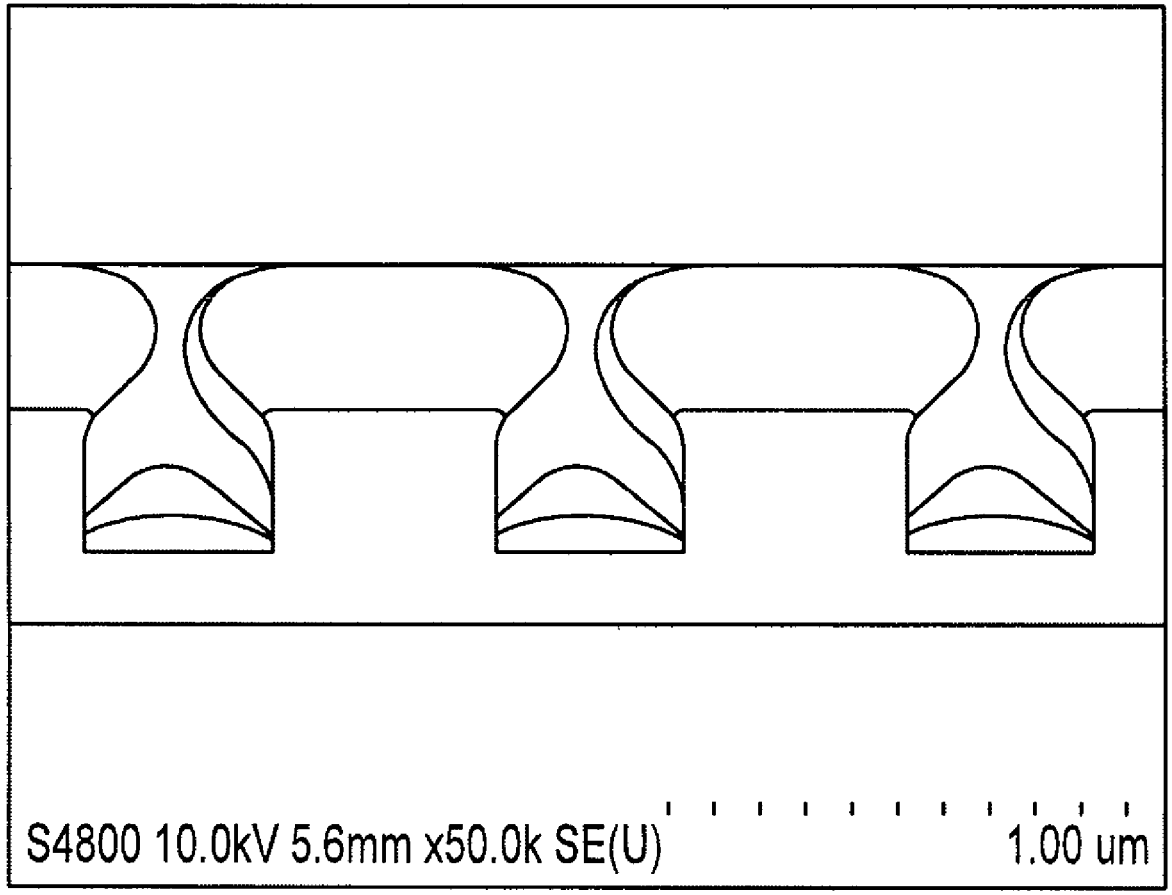
FIG. 1 is a scanning electron microscope (SEM) photograph showing a cross-sectional view of a non-conformal amorphous carbon layer formed on an irregular surface.

Embodiments will be explained below. The embodiments are not intended to limit the present invention. Additionally, elements used in an embodiment can be used in another embodiment in combination with other elements or can replace another element used in another embodiment unless special conditions are attached.

For double patterning of contact array with a carbon layer, for example, it is important to form a conformal film having a conformal ratio of substantially or nearly one so as to produce projections having a side wall substantially or nearly perpendicular to a reference surface. In an embodiment, it can be realized by controlling the deposition of the conformal ratio of the depositing conformal amorphous hydrogenated carbon layer. The controlling step may comprise adjusting a step coverage of the conformal amorphous hydrogenated carbon layer to about 30% or higher (in another embodiment, about 50% or higher) as a function of substrate temperature, and adjusting a conformal ratio of the conformal amorphous hydrogenated carbon layer to about 0.9 to about 1.1 (in another embodiment, substantially or nearly one) as a function of RF power and/or argon gas flow rate, An embodiment may be applied to improve a method of depositing a conformal amorphous hydrogenated carbon layer on an irregular surface of a substrate by plasma CVD at a substrate temperature of A (° C.), an RF power of B (W/cm$^2$), and an argon flow rate of C (slm), said conformal amorphous hydrogenated carbon having a conformal ratio of about 1.5 or higher, said irregular surface being constituted by a top surface and multiple recesses, each recess having a side wall and a bottom surface, said side wall being substantially or nearly perpendicular to the top surface, said bottom surface being substantially or nearly parallel to the top surface. In an embodiment, the improvement may comprise changing the substrate temperature to a value lower than A (° C.), preferably 50° C. or lower, as a primary parameter, so as to reduce the conformal ratio to about 1.2 to about 1.4, and changing the RF power to a value lower than B (W/cm$^2$), as a secondary parameter, so as to further reduce the conformal ratio to about 1.0 to about 1.1, and adjusting the Ar gas flow to a value lower than C (slm) so as to further reduce the conformal ratio or a value higher than C (slm) so as to increase the conformal ratio, as an adjustment parameter, thereby obtaining a desired conformal ratio in the range of about 0.80 to about 1.05.

In an embodiment, while controlling a substrate temperature approximately at A (0° C.), an RF power approximately at B (W) and a flow rate of the argon gas approximately at C (slm), the following relations may be satisfied: A≦50, and 100≦BxC≦300, thereby adjusting a step coverage of the layer at 30% or higher, and a conformal ratio of the layer at about 0.9 to about 1.1.

In an embodiment, the hydrocarbon-containing precursor may have a carbon/hydrogen ratio (C/H) of 0.55 or higher. The hydrocarbon-containing precursor may be cyclic. In an embodiment, the hydrocarbon-containing precursor may be cyclopenten. Alternatively, the hydrocarbon-containing precursor may be non-cyclic. In an embodiment, the hydrocarbon-containing precursor may be isoprene.

In an embodiment, the additional gases may be helium/argon or helium/krypton. In an embodiment, the helium/argon or the helium/krypton may be maintained at a ratio of the molar flow rate of about 5/1 to about 10/1, wherein seal gas is not included in the calculation of the ratio.

In an embodiment, the forming of an amorphous hydrogenated carbon layer on the semiconductor substrate by plasma polymerization may comprise applying RF power of between approximately 10 Watt and approximately 1000 Watt; and setting the reaction chamber pressure at between approximately 0.1 Torr and approximately 10 Torr. In the above, the values in Watt are values suitable for processing a 200-mm wafer or the like, and if a 300-mm wafer is processed, the values may be increased. The values can be expressed using W/cm$^3$ (Watt per unit area of a 200-mm wafer). However, because a value suitable for a 300-mm wafer need not proportionally be 1.5 times higher than that for a 200-mm wafer, the values based on W/cm$^3$ needs to be adjusted by ±0.3 W/cm$^3$ depending on the apparatus type, reactor size, wafer size, etc.

In an embodiment, the amorphous hydrogenated carbon layer formed on the substrate may have a density of more than 0.9 g/cm$^3$ and a compressive stress of 0~100 MPa.

In the disclosure, the irregular surface may be constituted by a top surface and multiple recesses, each recess having a side wall and a bottom surface, said side wall being substantially or nearly perpendicular to the top surface, said bottom surface being substantially or nearly parallel to the top surface, and the step coverage may typically be defined as a ratio of an average thickness of a portion of the conformal amorphous hydrogenated carbon layer deposited on the side wall of the recess to an average thickness of a portion of the conformal amorphous hydrogenated carbon layer deposited on a top surface, and the conformal ratio may typically be defined as a ratio of a thickness of a portion of the conformal amorphous hydrogenated carbon layer deposited at a top of the side wall of the recess to a thickness of a portion of the conformal amorphous hydrogenated carbon layer deposited at a midpoint of the side wall of the recess or at a lowest point along the side wall of the recess if the lowest point is higher than the midpoint. Even if the top surface is not flat but rounded and the conformal layer is thick and significantly fills the recess, the above definition can be applied as shown in FIG. 9A.

Figure 9A:
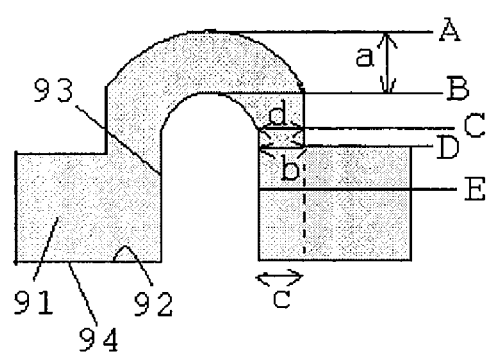
FIGS. 9A and 9B are schematic illustrations explaining measurements of a conformal amorphous hydrogenated carbon layer formed on a convex surface according to an embodiment of the present invention.

In FIG. 9A, the irregular surface is constituted by a top surface (B) and multiple recesses (94), each recess has a side wall (93) and a bottom surface (92), the side wall (93) is substantially or nearly perpendicular to the top surface (B), and the bottom surface (92) is substantially or nearly parallel to the top surface (B). The top of the substantially or nearly vertical side wall (93) is located at point C. The lowest point along the side wall (93) is located at point D which is higher than a midpoint (E) of the side wall (93). Thus, in this configuration, the step coverage can be defined as a ratio of an average thickness (c) of a portion of the conformal amorphous hydrogenated carbon layer (91) deposited on the side wall (93) of the recess to an average thickness (a=A−B) of a portion of the conformal amorphous hydrogenated carbon layer deposited on a top surface (B), and the conformal ratio is defined as a ratio of a thickness (d) of a portion of the conformal amorphous hydrogenated carbon layer deposited at a top of the side wall (C) of the recess to a thickness (b) of a portion of the conformal amorphous hydrogenated carbon layer deposited at a lowest point along the side wall of the recess (D) where the lowest point (D) is higher than the midpoint (E).

Figure 9B:
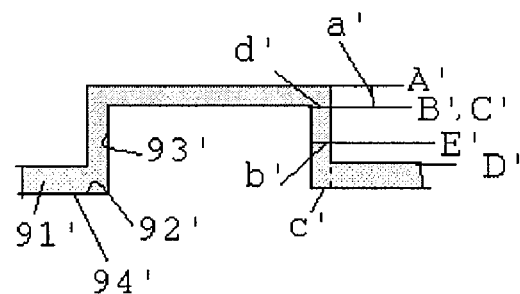

In FIG. 9B, the step coverage can be defined as a ratio of an average thickness (c') of a portion of the conformal amorphous hydrogenated carbon layer (91') deposited on the side wall of the recess (94') to an average thickness (a'=A'−B') of a portion of the conformal amorphous hydrogenated carbon layer deposited on the top surface (B'), and the conformal ratio can be defined as a ratio of a thickness (d') of a portion of the conformal amorphous hydrogenated carbon layer deposited at a top of the side wall (B') of the recess to a thickness (b') of a portion of the conformal amorphous hydrogenated carbon layer deposited at a midpoint of the side wall (E') of the recess where the lowest point (D') of the side wall is lower than the midpoint (E').

FIG. 1 shows a SEM cross-sectional view showing a substrate with a conventional non-conformal amorphous carbon layer formed under the following conditions.

Isoprene: 100-120 sccm
Argon: 2.5 slm
Nitrogen: None
Process helium: 0.7 slm
Seal helium: 50 sccm
Carrier helium: 300 sccm
Pressure: 5-6 Torr
RF power: 2.5 W/cm2
Deposition time: 2 min 10 sec
Substrate temp.: 340° C.

Because the conventional non-conformal amorphous carbon layer does not completely cover the sidewalls of feature, subsequent etching processes may result in unwanted erosion of sidewalls. The lack of complete coverage of sidewalls due to the non-conformal amorphous carbon layer may also lead to photoresist poisoning of the material, which is known to cause damage to electronic devices.

In an embodiment, in order to form a substantially complete conformal layer, the substrate temperature is reduced from 340° C. to lower than 200° C. (preferably 0° C. to 50° C.), the Ar gas flow is about ¼ of the above, the He gas flow is about 4 times greater than the above, the PR power is about ½ of the above, and nitrogen gas is introduced.

Embodiments of the present invention provide a method of forming a conformal hydrocarbon-containing polymer layer on a semiconductor substrate by a capacitively-coupled plasma CVD, which comprise; vaporizing a hydrocarbon-containing precursor ($C_\alpha H_\beta X_\gamma$, where $\alpha$ and $\beta$ are natural number, $\gamma$ is an integer including zero; X is O, N or F); introducing said vaporized gas and additional gases into a CVD reaction chamber inside which a semiconductor substrate is placed; semiconductor substrate temperature maintaining between approximately 0° C. to 200° C.; and forming a hydrocarbon-containing polymer film on said semiconductor substrate by plasma polymerization of said gas.

In the above embodiment, the liquid monomer may be cyclic or non-cyclic, such as cyclopentene, isoprene. In any of the foregoing embodiments, the liquid monomer may have a carbon/hydrogen ratio (C/H) of 0.55 or higher, preferably 0.6 or higher.

In any of the aforesaid embodiments, only said liquid monomer may be used as a reaction gas.

In any of the aforesaid embodiments, the liquid monomer may be introduced into a vaporizer disposed upstream of said reaction chamber and vaporized. In the above, the liquid monomer may be flow-controlled upstream of said vaporizer by a valve, and its introduction into said vaporizer may be blocked, except when a film is being deposited, by a shutoff valve disposed between said flow control valve and said vaporizer and kept approximately at 5° C. or lower.

A flow rate of hydrocarbon precursor is not particularly restricted, but as a flow rate introduced into a reaction chamber after vaporization, in an embodiment, it is approximately 20 sccm to approximately 1000 sccm.

Additionally, an additive gas can be introduced into a reaction chamber. For example, the additional gas can be one of or a combination of two or more of He, Ar, Ne, Kr, Xe, and N2; preferably He or/and Ar. A flow rate of an additional gas introduced into a reaction chamber is approximately 30 sccm to 3000 sccm.

A plasma polymerization can be preformed in an embodiment under the conditions: a substrate temperature of approximately 0° C. to 200° C. (including a range of 0° C.-70° C. and a range of 50° C.-150° C.), a reaction pressure of approximately 0.1 Torr to 10 Torr (including a range of 1 Torr-8 Torr, a range of 3 Torr-6 Torr, and a range of 5 Torr-6 Torr in embodiments). As to RF power density, a plasma polymerization step is preformed under the conditions of: RF power density of approximately 0.02 $W/cm^2$ to 7 $W/cm^2$ per substrate area (including a range of 0.05~5 $W/cm^2$, and a range of 0.5~3 W/cm2 in embodiments). Additionally, a plasma polymerization step can be performed using a frequency exceeding 5 MHz, e.g., any on of high RF frequency power of 13.56 MHz, 27 MHz or 60 MHz, in an embodiment; further, one of the foregoing high RF frequency power and low RF power of 5 MHz or less can be combined.

In the present disclosure where conditions and/or structures are not specified, the skilled artisan in the art can readily provide such conditions and/or structures, in view of the present disclosure, as a matter of routine experimentation.

EXAMPLE

Substantially Complete Conformal Layer

One of advantages of the disclosed embodiments is the significant enhancement of conformality as compared with other amorphous carbon deposition processes. For forming a conformal amorphous carbon layer on a semiconductor substrate, deposition conditions in embodiments may be as follows:

Isoprene: 10~300 sccm
Argon: 0~3000 sccm
Nitrogen: 0~1000 sccm
Process helium: 3000 sccm
Sealed helium: 50 sccm
Carrier helium: 300 sccm
Substrate temperature: 0~300° C.
RF power: 0.02 $W/cm^2$~7 $W/cm^2$
Pressure: 0.1~10 Torr
Deposition time: 30 sec.

Figure 2:
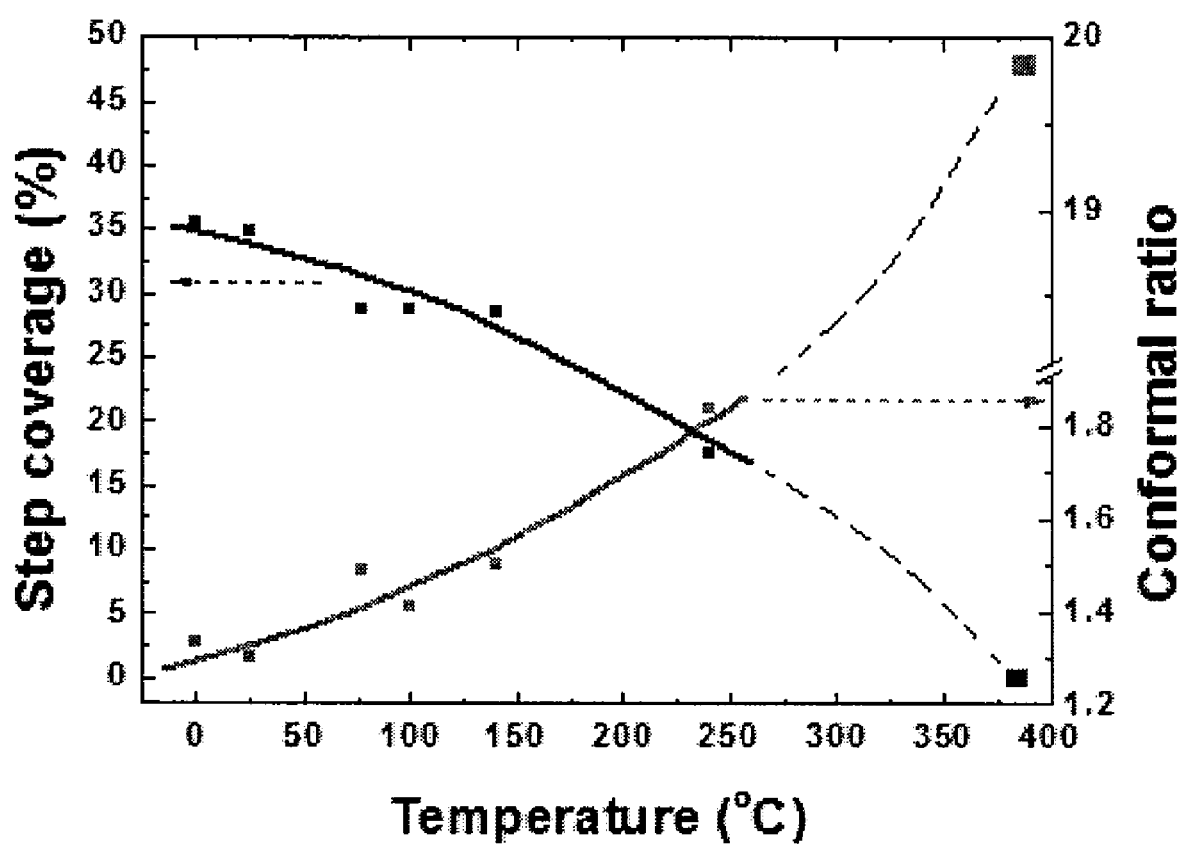
FIG. 2 is a graph demonstrating the relationship between substrate temperature and step coverage and the relationship between substrate temperature and conformal ratio of an amorphous hydrogenated carbon layer deposited on an irregular surface according to embodiments of the present invention.

FIG. 2 shows step coverage and conformal ratio changes of a deposited amorphous carbon layer with reference to substrate temperature, which layer was formed under the following conditions:

Isoprene: 115 sccm
Argon: 800 sccm
Nitrogen: 0 sccm
RF power: 2.55 $W/cm^2$ (800 W)
Pressure: 5.5 Torr In this figure, the step coverage and conformal ratio can be defined as described earlier or the step coverage or conformality may be defined as the ratio percent of the average thickness of amorphous carbon layer deposited on the sidewalls to the average thickness of amorphous carbon layer on upper surface of substrate, and the conformal ratio may be defined as the ratio of the thickness of amorphous carbon layer deposited on the sidewall at top to the thickness of amorphous carbon layer deposited on the sidewall at half height (e.g., conformal ratio(CR)>1 means an over-hang manner, CR<1 means a flowable manner, and CR=1 means a well conformal manner). As shown FIG. 2, the conformality increase to approximately 37% as the substrate temperature decreases. Also CR is nearing 1 as the substrate temperature decreases.

In this example, the substrate temperature is a primary parameter for reducing the conformal ratio and especially for increasing the step coverage. By reducing the substrate temperature, both the step coverage and conformal ratio can effectively and remarkably be controlled. The step coverage can be increased to about 30% or higher, and the conformal ratio can be reduced to a range of about 1.2 to about 1.4.

Figure 7:
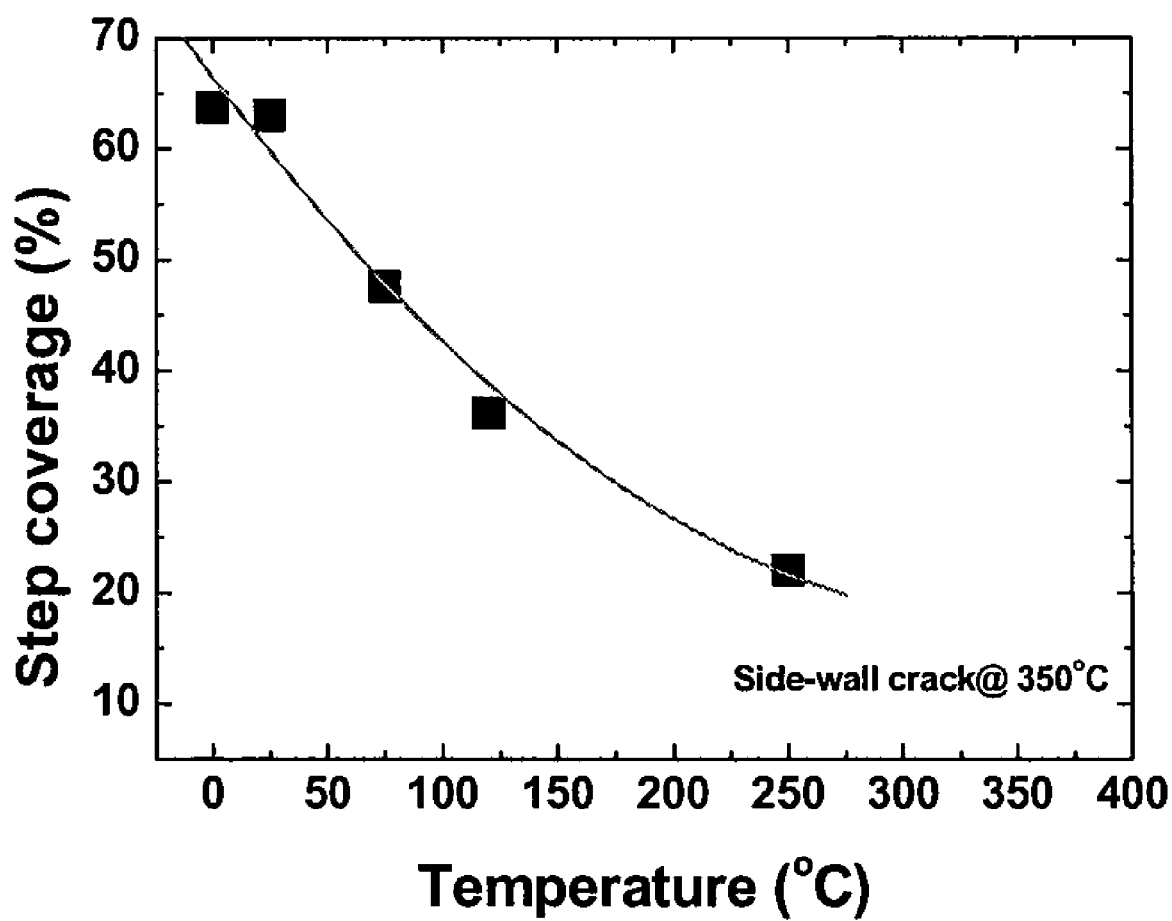
FIG. 7 is a graph showing the relationship between substrate temperature and step coverage of an amorphous hydrogenated carbon layer formed on an irregular surface according to embodiments of the present invention.

FIG. 7 shows the relationship between step coverage and substrate temperature according to another embodiment where an amorphous hydrogenated carbon layer was formed under the following conditions:

Isoprene: 115 sccm
Argon: 600 sccm.
Nitrogen: 800 sccm
P-He: 3000 sccm
Seal-He: 50 sccm
C-He: 300 sccm
Substrate temperature: 0-350° C.

RF power: 1.3 W/cm2 (400 W)
Pressure: 733 Pa (5.5 Torr)

In this example, the step coverage can be reduced to about 50% or higher by reducing the substrate temperature. When the substrate temperature was 50° C. or lower, the step coverage became higher than about 60%. The amorphous hydrogenated carbon layer had a conformal ratio of about 1.0.

Figure 3:
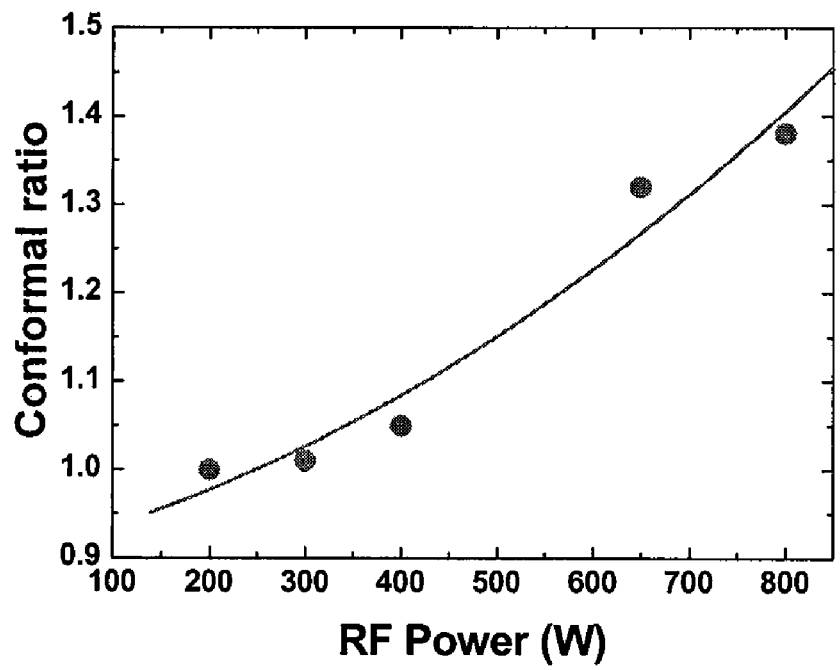
FIG. 3 is a graph demonstrating the relationship between RF power and conformal ratio of an amorphous hydrogenated carbon layer deposited on an irregular surface according to embodiments of the present invention.

FIG. 3 shows the conformal ratio changes of a deposited amorphous carbon layer with reference to RF power which changes from 100 W to 800 W (0.3 W/cm$^2$ to 2.6 W/cm$^2$) at a point shown in FIG. 2 where the substrate temperature is about 0° C.-25° C. The amorphous hydrogenated carbon layer was formed under the following conditions.

Isoprene: 115 sccm
Argon: 800 sccm
Nitrogen: 0 sccm
Substrate temperature: 0-25° C.
Pressure: 5.5 Torr In this example, the RF power is a secondary parameter for reducing the conformal ratio. By reducing the RF power, the conformal ratio can effectively and remarkably be controlled. The conformal ratio can be reduced to a range of about 1.1 to about 1.0 when the RF power is controlled in a range of about 150 W to about 450 W.

The conformal ratio is increased to approximately 1.4 with increasing RF power. A conformal ratio of 1.4 means, for example, if thickness on the sidewall at half height is 30 nm, thickness on the sidewall at top is 42 nm (over-hang deposition).

Figure 4:
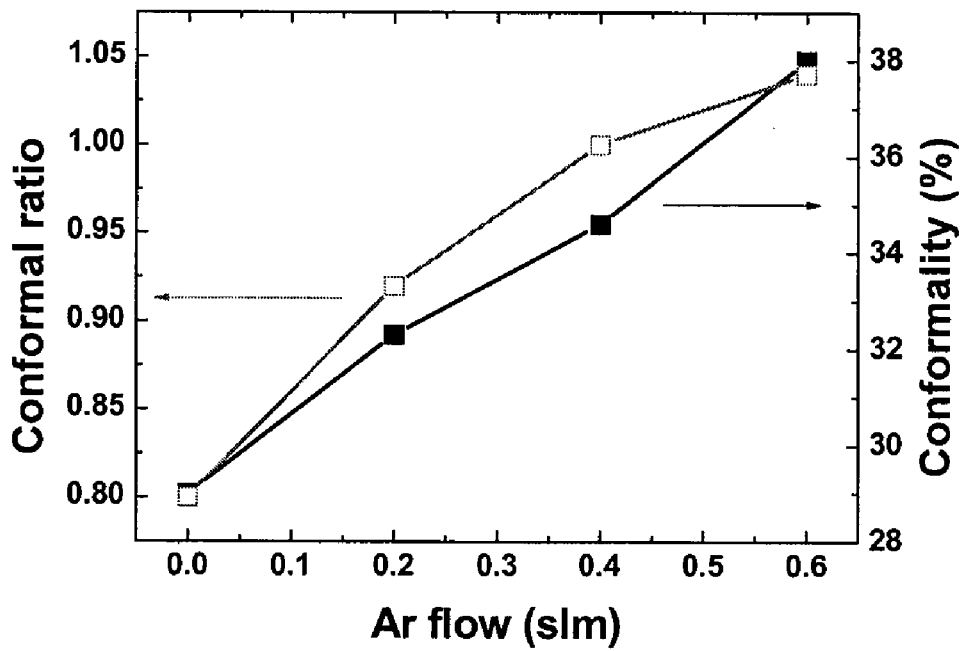
FIG. 4 is a graph demonstrating the relationship between Ar gas flow and conformal ratio and the relationship between Ar gas flow and step coverage of an amorphous hydrogenated carbon layer according to embodiments of the present invention.

FIG. 4 also shows the step coverage and conformal ratio changes of a deposited amorphous carbon layer with reference to argon flow which changes from 0.6 slm to zero slm at a point shown in FIG. 3 where the RF power is about 400 W (the point where the argon flow was 0.8 slm was omitted). The amorphous hydrogenated carbon layer was formed under the following conditions.

Isoprene: 115 sccm
Nitrogen: 0 sccm
Substrate temperature: 0-25° C.
RF power: 1.8 W/cm$^2$ (400 W)
Pressure: 5.5 Torr In this example, the Ar gas flow is an adjustment parameter for reducing the conformal ratio. By adjusting the Ar gas flow in a range of zero to 0.6 slm, the conformal ratio can effectively and remarkably be adjusted in a range of about 0.80 to about 1.05, and the step coverage can effectively and remarkably be adjusted in a range of about 38% to about 29%. Unlike the substrate temperature, when the Ar gas flow changes, both the conformal ratio and step coverage change in the same direction, i.e., when the conformal ratio decreases, the step coverage also decreases. In contrast, when the substrate temperature changes, the conformal ratio and step coverage change in different directions, i.e., when the conformal ratio decreases, the step coverage increases as shown in FIG. 2. Also in view of the above, the substrate temperature rather than the Ar gas flow is preferably used as a primary parameter.

Figure 5A:
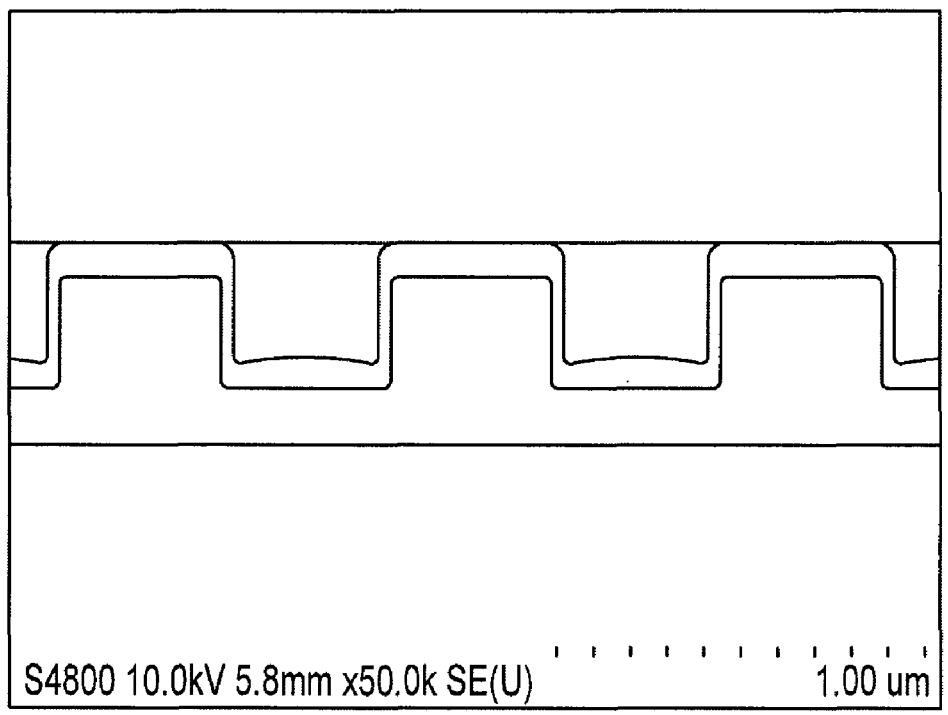
FIGS. 5A and 5B are SEM photographs showing cross-sectional views of a conformal amorphous hydrogenated carbon layer formed on an irregular surface according to embodiments of the present invention.
Figure 5B:
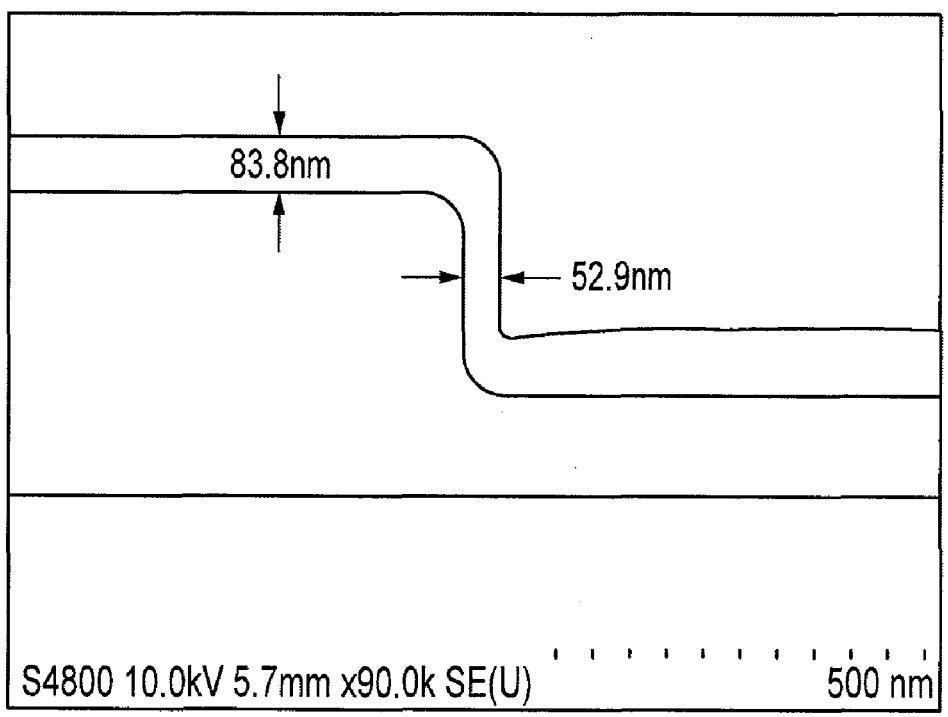

Above factors, e.g., substrate temperature, RF power, additional gases, in conjunction with the higher sticking probability of —CH$_x$ radicals on the substrate surface result in the improvement in conformality depicted in FIGS. 5A and 5B. Qualitatively, the amorphous carbon layer is highly conformal and completely covers sidewalls. The amorphous carbon layer may have a step coverage or conformality of approximately 45%~65%. The layer was formed under the following conditions:

Isoprene: 115 sccm
Argon: 600 sccm
Nitrogen: 800 sccm
Substrate temperature: 0-25° C.
RF power: 1.3 W/cm$^2$
Pressure: . . . 5.5 Torr Nitrogen flow can be used as a fine adjustment parameter for adjusting the conformal ratio. The effect of nitrogen gas is not as significant as Ar gas, and thus, is suitable as a fine adjustment parameter.

Figure 8A:
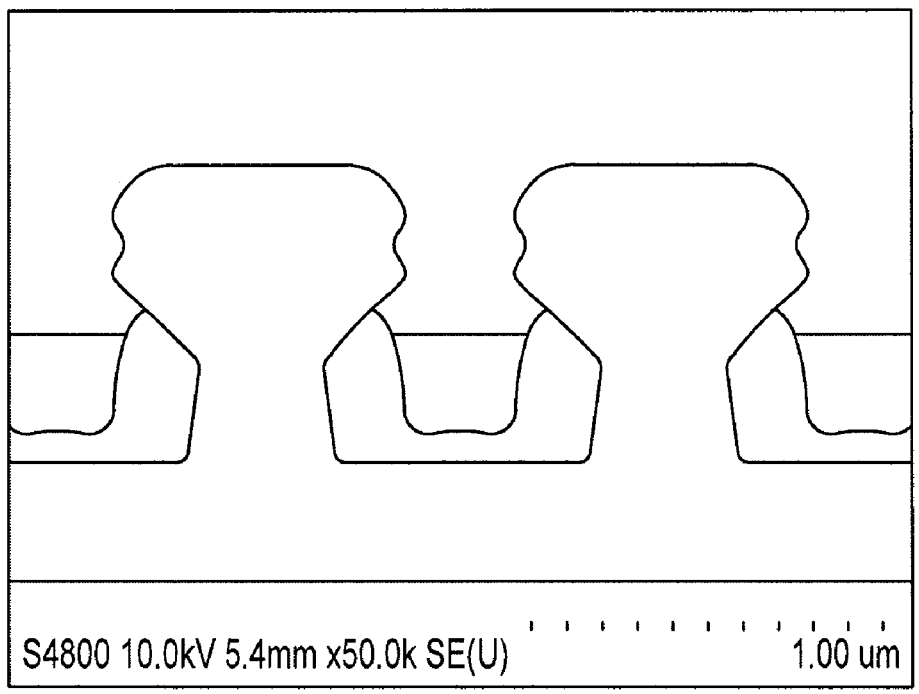
FIGS. 8A to 8E are SEM photographs showing cross sectional views of conformal amorphous hydrogenated carbon layers according to embodiments of the present invention.
Figure 8B:
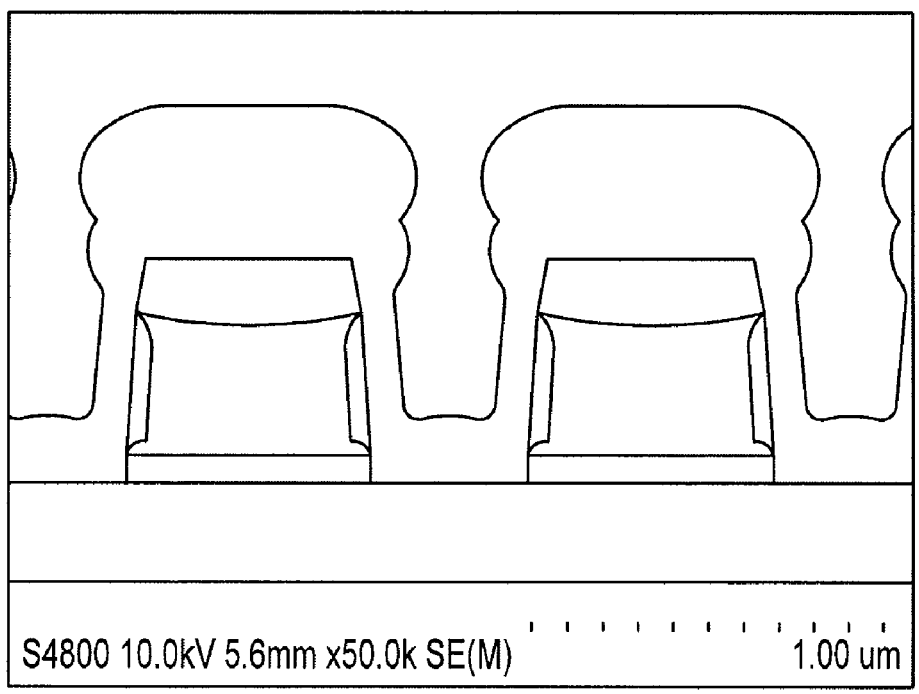
Figure 8C:
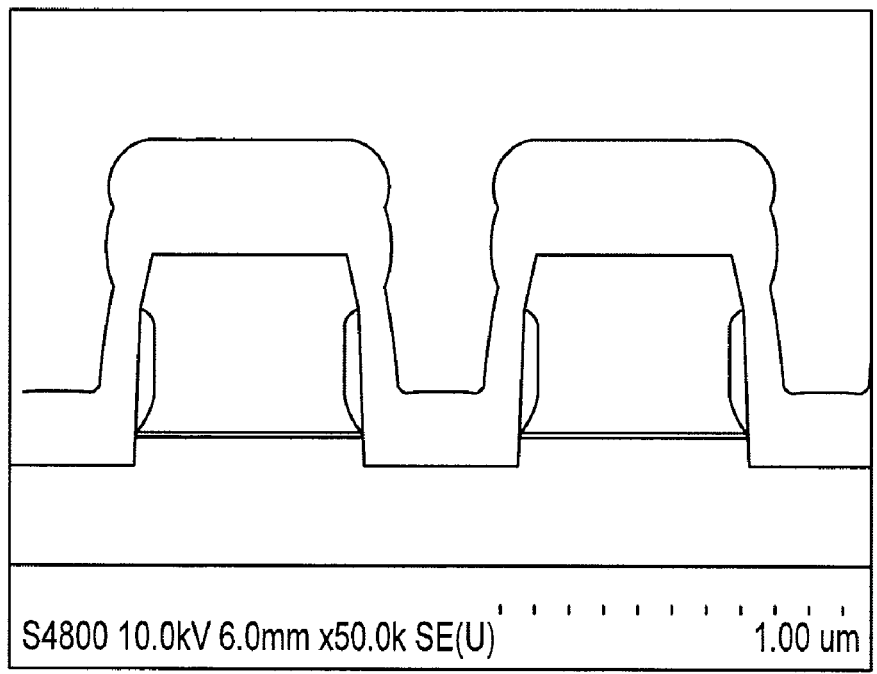
Figure 8D:
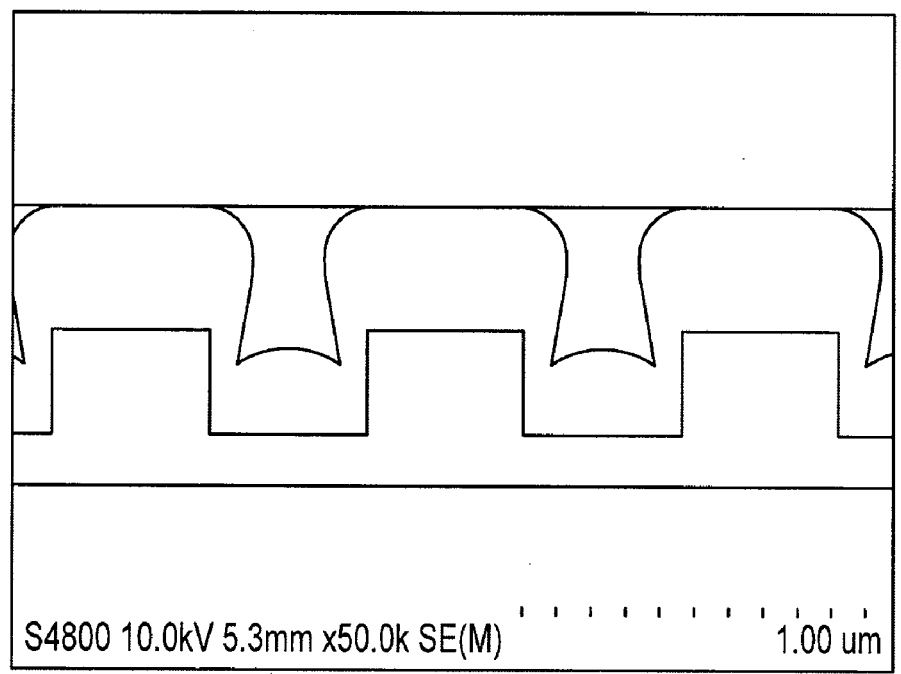
Figure 8E:
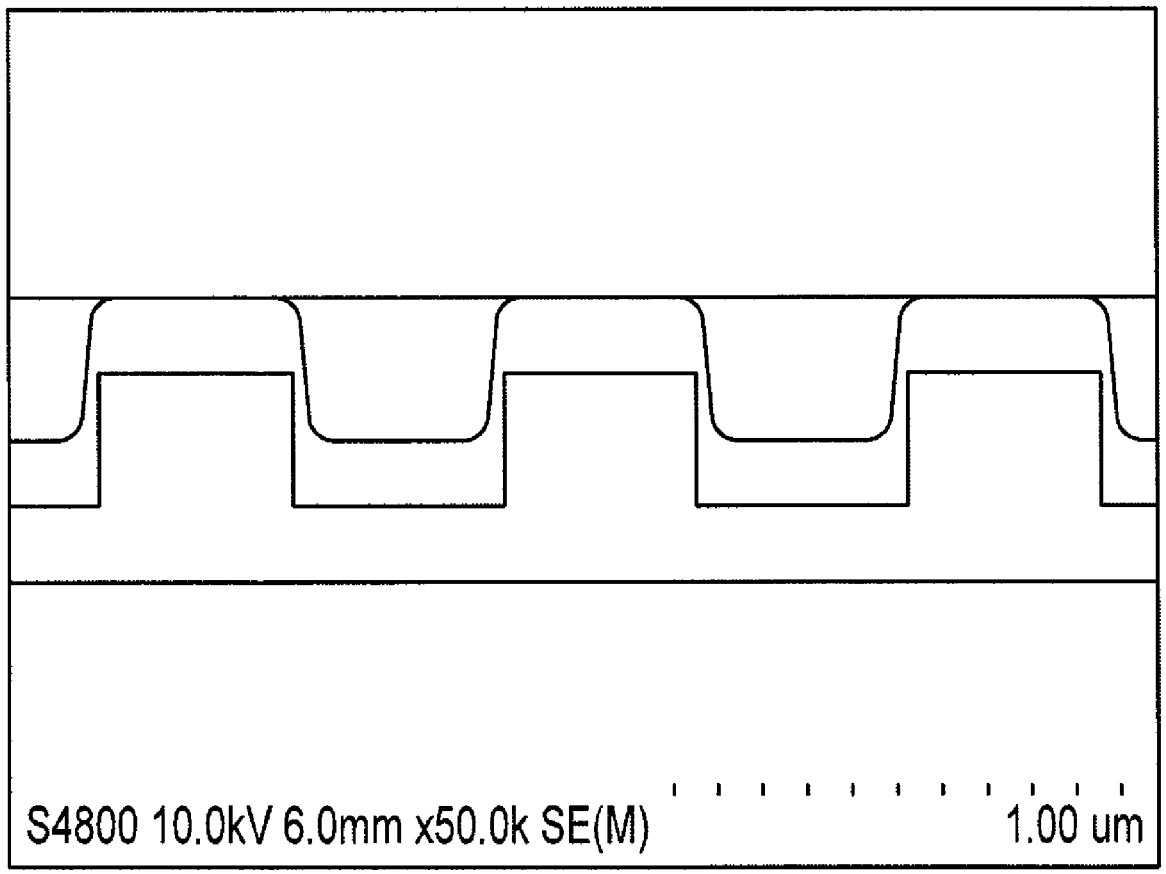

FIGS. 8A to 8E show SEM photographs of cross sectional views of conformal amorphous hydrogenated carbon layers formed according to the conditions corresponding to those used in relation to FIGS. 2 and 4, wherein the substrate temperature were 340° C. (FIG. 8A), 140° C. (FIG. 8B), and 0° C. (FIG. 8C), and the Ar gas flow were 800 sccm (FIG. 8D) and 0 sccm (FIG. 8E). As shown in FIGS. 8A to 8C, by reducing the substrate temperature, the step coverage can increase and the conformal ratio can decrease, and at about 0° C., the conformal ratio became about one. As shown in FIGS. 8D and 8E, when the Ar gas flow exceeds 600 sccm, the conformal ratio became high and the step coverage became low.

EXAMPLE

Resist Pattern for Double Patterning

Another advantage of an conformal amorphous carbon deposition process is that a lower temperature process may be used as sacrificial layer on a resist pattern for double patterning technology.

For forming conformal amorphous carbon layer on a resist pattern, deposition conditions in embodiments may be as follows:

Isoprene: 10~300 sccm (preferably 100~120 sccm)
Argon: 0~3000 sccm (preferably 400~600 sccm)
Nitrogen: 0~1000 sccm (preferably 400~600 sccm)
Process helium: 3000 sccm
Sealed helium: 50 sccm
Carrier helium: 300 sccm
Substrate temperature: 0~150° C. (preferably 0~50° C.)
RF power: 0.02 W/cm$^2$~7 W/cm$^2$ (including a range of 0.05~5 W/cm$^2$, and a range of 0.5~3 W/cm$^2$ in embodiments).
Pressure: 0.1~10 Torr (preferably 5~6 Torr)
Deposition time: 30 sec.

Figure 6:
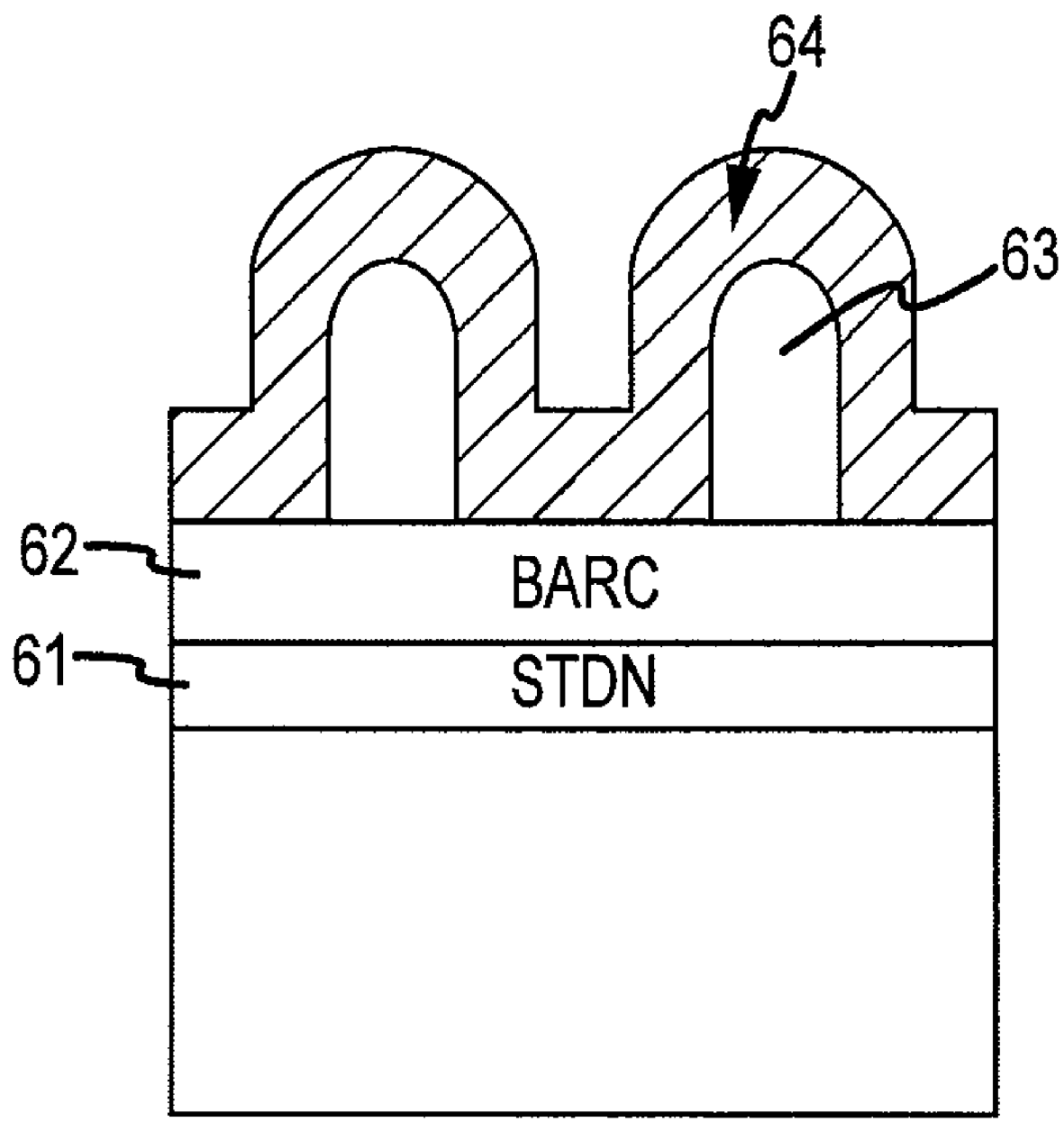
FIG. 6 is a schematic illustration of a cross-sectional view of a conformal amorphous hydrogenated carbon layer formed on a photo-resist according to an embodiment of the present invention.

The obtained amorphous carbon film differ, depending on the process conditions, in an embodiments, shows a step coverage of more than 50%, a modulus in the range of approximately 6.5~7.5 GPa. and hardness in the range of approximately 0.3~0.5 GPa. Additionally, in another embodiment, the density of the amorphous carbon film may be more than 0.9 g/cm$^3$. Further, in anther embodiment, RI(n)@633 nm is in the range of approximately 1.57~1.60. FIG. 6 illustrates a cross-sectional view of a conformal amorphous carbon layer 64 formed on a photoresist pattern 63 for lithography under the following conditions.

Isoprene: 100~120 sccm
Argon: 600 sccm
Nitrogen: 800 sccm
Process helium: 3.0 slm
Seal helium: 50 sccm
Carrier helium: 300 sccm
Pressure: 733 Pa
RF power: 1.27 W/cm$^2$ (400 W)
Deposition time: 30 sec
Substrate temp.: 0-25° C.

In FIG. 6, the photoresist pattern 63 is formed on a BARC layer 62 formed on a SiON layer 61. The photoresist pattern had a width of 30 nm, a height of 60 nm to 90 nm, and an interval of 90 nm. The conformal amorphous hydrogenated carbon layer was formed on a side wall at a thickness of 30 nm. The conformal ratio of the layer was about one and the step coverage was about 50%.

As illustrated in FIG. 6, amorphous carbon layer can be deposited highly conformal and completely covers sidewalls of the photoresist patterns, further, forming a gap between respective facing portions of the amorphous carbon layer on the sidewalls of the photoresist patterns.

Figure 10:
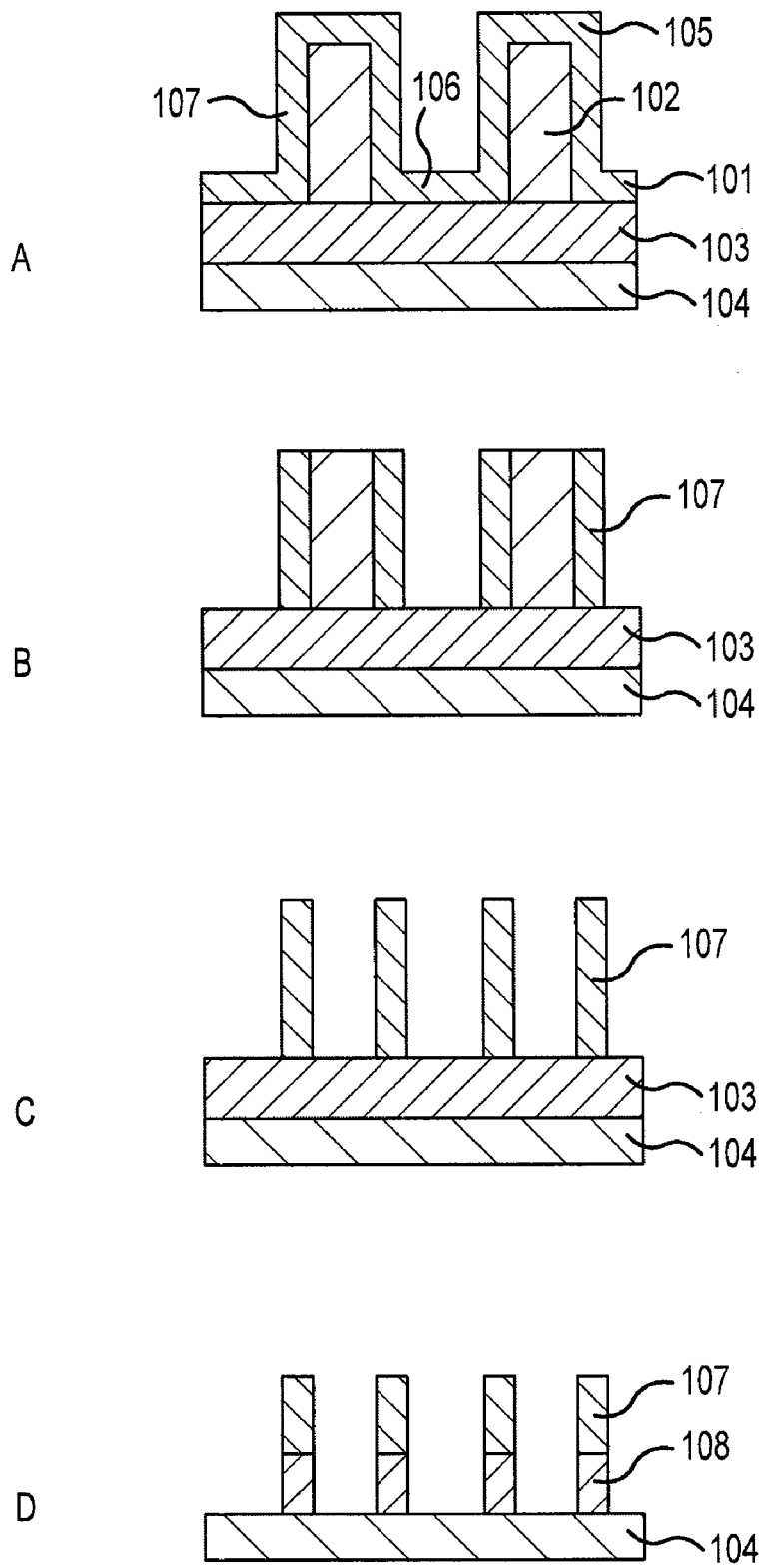
FIGS. 10A to 10D are schematic illustrations showing processes of double pattering using an amorphous hydrogenated carbon layer according to an embodiment of the present invention.

FIG. 10 shows double patterning processes using a conformal amorphous hydrogenated carbon layer according to an embodiment. On a substrate 104, a BARC is formed. A photoresist 102 is formed by photolithography. A conformal amorphous hydrogenated carbon layer 102 is then deposited and covers all exposes surfaces as shown in FIG. 10A, according to any of the disclosed embodiments. The structures are subject to dry etching, thereby etching a top layer 105 and a bottom layer 106 and leaving a side wall 107 as shown in FIG. 10B. Activated ions etch predominantly the top layer 105 and the bottom layer 106 due to their vertical directionality of reaction. The photoresist 102 is then etched, thereby leaving the side walls 107 arranged at constant intervals as shown in FIG. 10C. BARC etching is then conducted so as to produce contact array comprising protrusions 107, 108.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method of forming a conformal amorphous hydrogenated carbon layer on an irregular surface of a semiconductor substrate by plasma CVD, said irregular surface being constituted by a top surface and multiple recesses, each recess having a side wall and a bottom surface, said side wall being substantially or nearly perpendicular to the top surface, said bottom surface being substantially or nearly parallel to the top surface, said method comprising:

vaporizing a hydrocarbon-containing precursor;

introducing said vaporized precursor and an argon gas into a CVD reaction chamber inside which the semiconductor substrate is placed;

depositing a conformal amorphous hydrogenated carbon layer on the irregular surface of the semiconductor substrate by plasma polymerization of the precursor; and controlling the deposition of the conformal ratio of the depositing conformal amorphous hydrogenated carbon layer, said controlling comprising (a) adjusting a step coverage of the conformal amorphous hydrogenated carbon layer to about 30% or higher as a function of substrate temperature, and (b) adjusting a conformal ratio of the conformal amorphous hydrogenated carbon layer to about 0.9 to about 1.1 as a function of RF power and/or argon gas flow rate, said step coverage being defined as a ratio of an average thickness of a portion of the conformal amorphous hydrogenated carbon layer deposited on the side wall of the recess to an average thickness of a portion of the conformal amorphous hydrogenated carbon layer deposited on the top surface, said conformal ratio being defined as a ratio of a thickness of a portion of the conformal amorphous hydrogenated carbon layer deposited at a top of the side wall of the recess to a thickness of a portion of the conformal amorphous hydrogenated carbon layer deposited at a midpoint of the side wall of the recess or at a lowest point along the side wall of the recess if the lowest point is higher than the midpoint.

2. The method according to claim 1, wherein the adjusting of the step coverage is performed at a substrate temperature of about 50° C. or lower.

3. The method according to claim 1, wherein the adjusting of the conformal ratio is performed at an RF power of about 450 W or lower.

4. The method according to claim 1, wherein the adjusting of the conformal ratio is performed at an argon gas flow rate of about 0.1 slm to about 0.8 slm.

5. The method according to claim 1, wherein the recesses are formed by photo resist patterns each having a width of 10 nm to 100 nm and a height of 10 nm to 100 nm, and arranged at intervals each being about three times the width, wherein the conformal amorphous hydrogenated carbon layer is deposited on the side wall of the recesses at a thickness which is about the same as the width of the photo resist pattern, thereby arranging the conformal amorphous hydrogenated carbon layer deposited on the side wall of the recesses at intervals each being about the same as the width of the photo resist pattern.

6. The method according to claim 1, wherein the conformal amorphous hydrogenated carbon layer is constituted by carbon and hydrogen without fluorine.

7. The method according to claim 1, wherein the conformal amorphous hydrogenated carbon layer is constituted by carbon and hydrogen without dopants.

8. The method according to claim 1, wherein the hydrocarbon-containing precursor has a carbon/hydrogen ratio (C/H) of 0.55 or higher.

9. The method according to claim 1, wherein the hydrocarbon-containing precursor is cyclic.

10. The method according to claim 9, wherein the hydrocarbon-containing precursor is cyclopenten.

11. The method according to claim 1, wherein the hydrocarbon-containing precursor is non-cyclic.

12. The method according to claim 11, wherein the hydrocarbon-containing precursor is isoprene.

13. The method according to claim 1, wherein the additional gases are helium/argon or helium/krypton.

14. The method according to claim 13, wherein the helium/argon or helium/krypton is maintained at a ratio of the molar flow rate of approximately 5:1 to 10:1.

15. The method according to claim 1, wherein the deposition of the amorphous hydrogenated carbon layer on the semiconductor substrate by plasma polymerization is conducted at an RF power of between approximately 10 Watt and approximately 1000 Watt, and at a reaction chamber pressure of between approximately 0.1 Torr and approximately 10 Torr.

16. The method according to claim 1, wherein the amorphous hydrogenated carbon layer depositing on the substrate has a density of more than 0.9 g/cm$^3$.

17. The method according to claim 16, wherein the amorphous hydrogenated carbon layer depositing on the substrate has a compressive stress of between 0 and 100 MPa.

* * * * *